(12) United States Patent
Kimura et al.

(10) Patent No.: US 6,804,277 B2
(45) Date of Patent: Oct. 12, 2004

(54) SEMICONDUCTOR LASER MODULE AND METHOD OF MAKING THE SAME

(75) Inventors: Toshio Kimura, Chiyoda-ku (JP); Sadayoshi Kanamaru, Chiyoda-ku (JP); Tomoya Kato, Chiyoda-ku (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 79 days.

(21) Appl. No.: 09/965,863

(22) Filed: Oct. 1, 2001

(65) Prior Publication Data

US 2002/0122446 A1 Sep. 5, 2002

(30) Foreign Application Priority Data

Sep. 29, 2000 (JP) ........................................ 2000-299638

(51) Int. Cl.⁷ ................................................ H01S 3/04
(52) U.S. Cl. .............................. 372/36; 372/33; 372/43; 372/45; 372/46; 372/47; 372/48; 372/49; 372/50
(58) Field of Search .................... 372/33–36, 43–50, 372/109

(56) References Cited

U.S. PATENT DOCUMENTS 5,022,930 A * 6/1991 Ackerman et al. .......... 136/251

FOREIGN PATENT DOCUMENTS

JP 07-130922 5/1995

* cited by examiner

Primary Examiner—Don Wong
Assistant Examiner—Delma R. Flores Riuz
(74) Attorney, Agent, or Firm—Oblon, Spivak, McClelland, Maier & Neustadt, P.C.

(57) ABSTRACT

A semiconductor laser module according to the present invention has a semiconductor laser element for outputting a laser beam and a package hermetically containing and sealing the semiconductor laser element. The package has a vent for introducing and/or exhausting a low heat conduction type gas into or from the package. The vent is hermetically sealed by swaging and welding the external end thereof after the low heat conduction type gas has been introduced into or exhausted form the package.

11 Claims, 4 Drawing Sheets

SEMICONDUCTOR LASER MODULE AND METHOD OF MAKING THE SAME

BACKGROUND OF THE INVENTION

The present invention relates to a semiconductor laser module and a method of making the same.

In general, the semiconductor laser module includes a high-purity inert gas injected thereinto and a hermetic seal formed through a seam welding or the like. This is because if the atmosphere in the interior of the package which contacts the semiconductor laser element contains moisture or organic matter, the semiconductor laser element may seriously be impaired in reliability by short-circuiting due to condensation or the like or by burning in the end faces of the semiconductor laser element due to deposition of the organic matter when they are used for a long time. It is thus desirable that the atmosphere in the interior of the package contains a low-moisture inert gas. In view of the price or the like, such a low-moisture inert gas is often nitrogen. A certain semiconductor laser element of a waveband such as 980 nm is known in which the burning due to the deposition of the organic matter can be prevented by oxygen. Thus, oxygen may be contained in the inert gas. Usually, a closure is seam welded on the main body of the package within the atmosphere of the above inert gas to manage the atmosphere.

Such a seam welding is broadly carried out within a glove box. The glove box may generally be in the form of a box-shaped airtight vessel on one side of which a glove panel is formed of plastic. A plurality of rubber gloves are mounted on the glove panel at its suitable locations. An operator can insert its hands into the gloves for actuating and/or operating the internal devices and instruments in an airtight manner.

Nitrogen always flows through the glove box to manage the component and moisture content of the gas within the glove box. If the introduction of nitrogen is ceased, the dew point in the glove box will increase due to moisture deposited on the glove box walls. To avoid such a problem, the flow rate of the nitrogen may be set relatively high, such as about 20 L/min. After the main body and closure of the package has been set, an internal seam welder is used to make sealing. An automated device may set and demount the semiconductor laser module before and after the welding process.

SUMMARY OF THE INVENTION

The first present invention provides a semiconductor laser module comprising:
- a semiconductor laser element configured to produce laser light; and
- a package being hermetically sealed and having an interior space that contains the semiconductor laser element, said package including a vent member that extends from said interior space to a space that is exterior to said package, wherein,
- when unsealed, said vent member being configured to transport a low heat conduction gas between the interior space and the exterior, and
- when sealed, said vent member being configured to prevent a flow of
- gas between the interior space and the exterior.

The second present invention provides a semiconductor laser module comprising:
- a semiconductor laser element configured to produce laser light; and
- a package being hermetically sealed and having an interior space that contains the semiconductor laser element, said package includes
  - means for providing a low heat conduction gas to the interior space, and means for exhausting gas from the interior space.

The present invention also provides a method for producing a semiconductor laser module, comprising steps of:
- disposing a semiconductor laser element in an interior space of a package;
- sealing the package, except for a vent member that communicatively connects said interior space and an exterior space when open;
- transporting a low heat conduction gas between the interior space and the exterior space through the vent member; and
- hermetically sealing the vent member.

BRIEF DESCRIPTION OF THE DRAWINGS

FIGS. 1A and B are cross-sectional side views of a semiconductor laser module constructed according to a first embodiment of the present invention: FIG. 1A shows the semiconductor laser module before the vent thereof is sealed and FIG. 1B shows the same after sealed.

FIGS. 2A and B are block diagrams of a system for introducing a low heat-conduction type gas into the semiconductor laser module according to the first embodiment of the present invention: FIG. 2A shows the module being evacuated and FIG. 2B shows the module into which the low heat-conduction type gas is being introduced.

FIG. 1A shows the module being evacuated and FIG. 1B shows the module into which the low heat conduction type gas is introduced.

DETAILED DESCRIPTION

Figure 1:
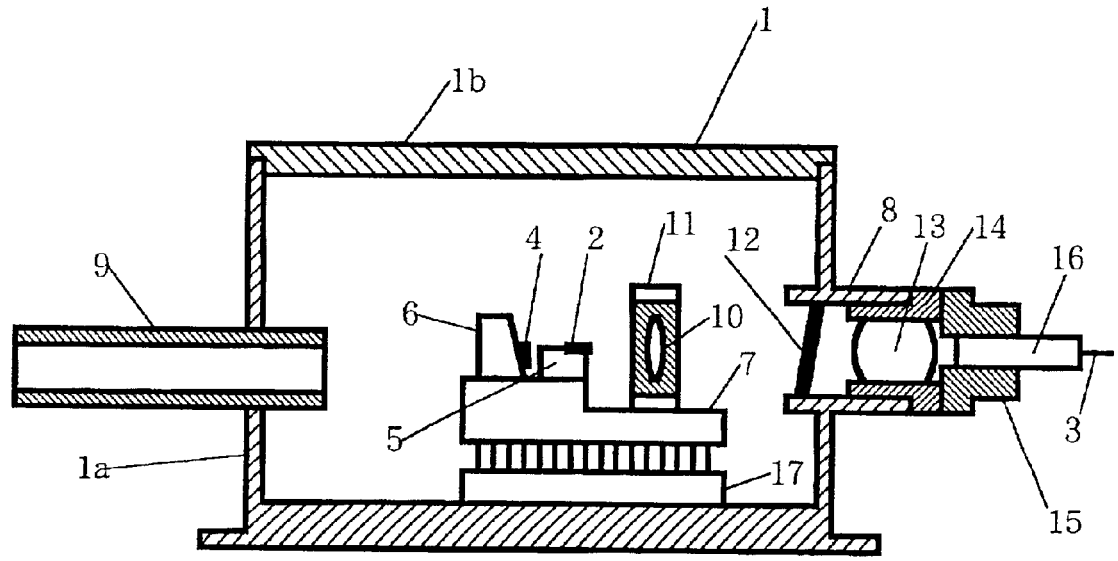
Figure 1:
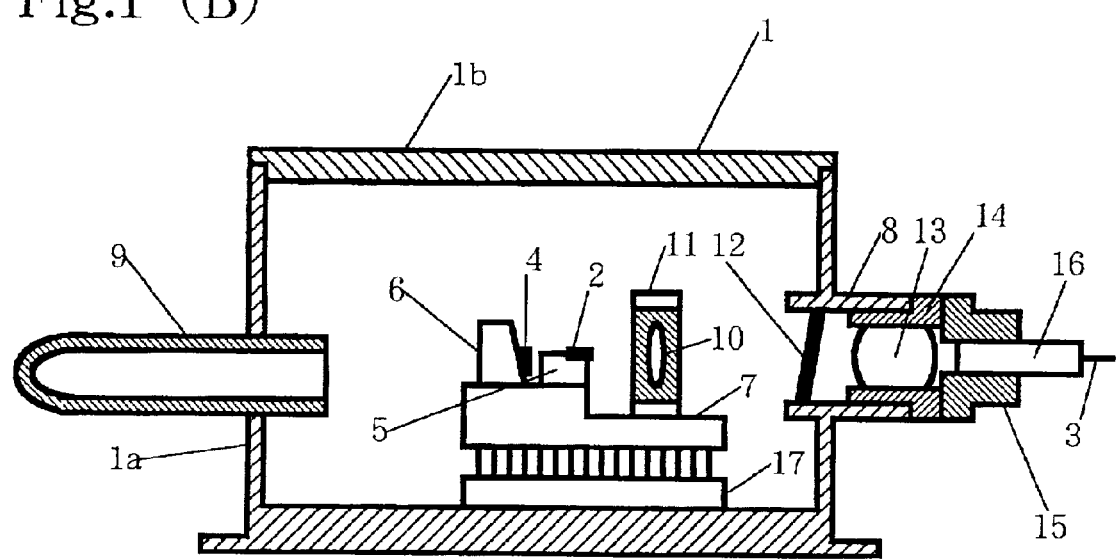

One characteristic required in the semiconductor laser module is that it can securely operate in a high-temperature circumstance, for example, up to about 75° C. For such a purpose, the semiconductor laser module is provided with a cooling system using a Peltier device. A thermistor senses the temperature in or near the semiconductor laser element. The cooling system is then actuated depending on the sensed temperature so that the temperature near the semiconductor laser element will generally be maintained about 25° C.

However, under the high-temperature circumstance, heat flows from the outside of the package to a low-temperature part near the semiconductor laser element due to the differential temperature therebetween. Such an inflow of heat is brought by the heat conduction from the gas (or nitrogen in many cases) in the interior of the package. In experiments, the inventors have found that the heating value in the semiconductor laser element to be cooled was 1.0–6 W while the inflow of heat reached about 0.5 W. The inflow of heat increases the load on the cooling system, thus seriously reducing the cooling property of the semiconductor laser module.

To maintain the cooling property of the semiconductor laser module even under the high-temperature circumstance, it is required that the heat conduction from the high-temperature part outside of the package to the low-temperature part near the semiconductor laser element is blocked. Various techniques for such a blocking have been developed.

For example, Japanese Patent Laid-Open Application No. Hei 7-130922 has proposed a semiconductor device including a cooling system for sealingly filling the interior of the semiconductor package with a low heat conduction type gas such as xenon (which will be referred to the prior art 1). According to the prior art 1, the heat conduction from the exterior high-temperature part to the low-temperature part near the semiconductor laser element is reduced even under the high-temperature circumstance since the xenon has its heat conductivity lower than that of the nitrogen. Thus, the cooling property of the semiconductor laser module can be improved and operated under a circumstance of higher output and temperature.

Japanese Patent Laid-Open Application No. Sho 58-43589 has proposed a semiconductor laser in which a vessel for hermetically sealing a semiconductor laser element is evacuated into vacuum to reduce the influence from the change of external temperature due to the heat conduction (which will be referred to the prior art 2). According to the prior art 2, the depressurization can further improve the effect of lower heat conduction so that the heat blocking between the low-temperature and high-temperature parts will be substantially perfect to provide a further improved cooling property in higher output and temperature operation.

However, the xenon used in the prior art 1 is very expensive. Where an increased amount of xenon is flowed into the glove box as in the prior art system, the use of semiconductor laser module becomes very expensive.

In the prior art 2, it is difficult in the presence of the gloves to depressurize the interior of the glove box. To avoid such a problem, there may be considered a technique of providing a seam welder in the interior of a vacuum chamber and evacuating the vacuum chamber after the main package body and closure have been set therein, thereafter remotely controlling the seam welder to seal the vacuum chamber. However, the evacuation in each preparing of the semiconductor laser module is very troublesome. Moreover, an automated seam welder for loading and unloading a number of semiconductor laser module sets has also proposed. Such an automated seam welder is expensive.

On the contrary, the semiconductor laser module and method of making the same according to the present invention may be of a simplified and inexpensive structure which can be used under the high-temperature circumstance without use of an increased amount of expensive noble gas and also without use of a vacuum chamber or automated seam welder.

Several embodiments of the present invention will now be described with reference to the drawings. FIGS. 1A and B are cross-sectional side views of a semiconductor laser module constructed according to a first embodiment of the present invention: FIG. 1A shows the semiconductor laser module before the vent thereof is sealed and FIG. 1B shows the same after sealed.

Referring to FIG. 1, the semiconductor laser module according to the first embodiment of the present invention comprises a hermetically sealed package 1, a semiconductor laser element 2 located in the package 1 and for outputting a laser beam, an optical fiber 3 for receiving the laser beam outputted from the semiconductor laser element 2, a photodiode 4 for receiving a monitoring laser beam outputted from the rearward side of the semiconductor laser element 2 (which is viewed on the left side in FIG. 1), a chip carrier 5 for holding the semiconductor laser element 2, a photodiode carrier 6 for holding the photodiode 4 and a base 7 for holding the chip and photodiode carriers 5, 6.

The package 1 has a main body 1a and a lid portion 1b covering the top of the main body 1a. The bottom portion of the main body 1a is made of CuW alloy, the remaining portion being formed of Kovar (trade name). The main body 1a of the package 1 includes a flange 8 formed on the forward head thereof (which is on the right side in FIG. 1) and a vent 9 formed on the rearward tail thereof (which is on the left side in FIG. 1) and for introducing/exhausting a low heat conduction type gas such as xenon or the like into the interior of the package.

The vent 9 may be of a pipe-shaped configuration which extends externally and internally from the tail of the package 1 (see FIG. 1A). For example, the pipe-shaped vent 9 may have its wall-thickness of 0.5 mm and its internal diameter of 1 mm while having its outer length of 20 mm and its inner length of 0.5 mm relative to the package 1. The vent 9 may be made of Kovar, for example. The vent 9 may be brazed to the package 1 through silver wax or the like or formed integrally with the package 1. After the low heat conduction type gas has been introduced into the package 1 through the vent 9 or after the gas has been exhausted from the package 1, the tip end of the vent 9 may temporarily be sealed by swaging and cut before the swaged portion and adjacent portion are welded to provide a sealing (see FIG. 1B). The welding process may be carried out through any of various suitable welding techniques such as ultra-sonic welding, TIC (Inert Gas Tungsten Arc) welding and the like.

When the vent 9 is mounted on the tail of the package 1, the latter can has its clean appearance and its reduced area occupying the space on a printed board or heat sink. The length of the vent 9 outwardly extending from the package 1 is preferably equal to or larger than 5 mm in view of the operability of swaging and welding, but preferably equal to or smaller than 25 mm in view of the reduction of package 1 size.

A first lens 10 for collimating the laser beam from the semiconductor laser element 2 is located on the base 7 in front of the semiconductor laser element 2. The first lens 10 is made of a metal such as stainless steel or the like and held by a first lens holder 11 on the base 7.

The flange 8, which is located on the forward head of the package 1, includes a window 12 for receiving the laser beam passed through the first lens 10 and a second lens 12 for condensing the laser beam. The second lens 12 is held by a second lens holder 14 which is fixedly mounted on the flange 8 of the package 1 through YAG laser welding.

The outer end of the second lens holder 14 includes a metallic slide ring 15 fixedly mounted thereon through YAG laser welding.

The forward end of the optical fiber 3 is held by a metallic ferrule 16 which is fixedly mounted in the interior of the slide ring 15 through YAG laser welding.

The base 7 is fixedly mounted on a cooling device 17 which is fixedly mounted on the inner bottom of the package 1. The cooling device 17 is designed to cool the semiconductor laser element 2 through a Peltier device therein. A raise of temperature due to heat produced by the semiconductor laser element 2 is sensed by a thermistor (not shown) which is mounted on the chip carrier 5, thereby controlling the cooling device 17 such that the temperature sensed by the thermistor will be maintained constant. Thus, the laser output of the semiconductor laser element can be stabilized.

The laser beam outputted from the forward side of the semiconductor laser element 2 is collimated by the first lens 10 and then condensed by the second lens 13 through the window 12. The condensed laser beam enters the optical fiber 3 held by the ferrule 16 and then exits from the optical fiber 3.

On the other hand, the monitoring laser beam outputted from the rearward side of the semiconductor laser element 2 is received by the photodiode 4. The amount of light received by the photodiode 4 is calculated to adjust the optical output power in the semiconductor laser element 2.

FIGS. 2A and B are block diagrams of a system for introducing a low heat-conduction type gas into the semiconductor laser module according to the first embodiment of the present invention: FIG. 2A shows the module being evacuated and FIG. 2B shows the module into which the low heat-conduction type gas is being introduced.

Figure 2:
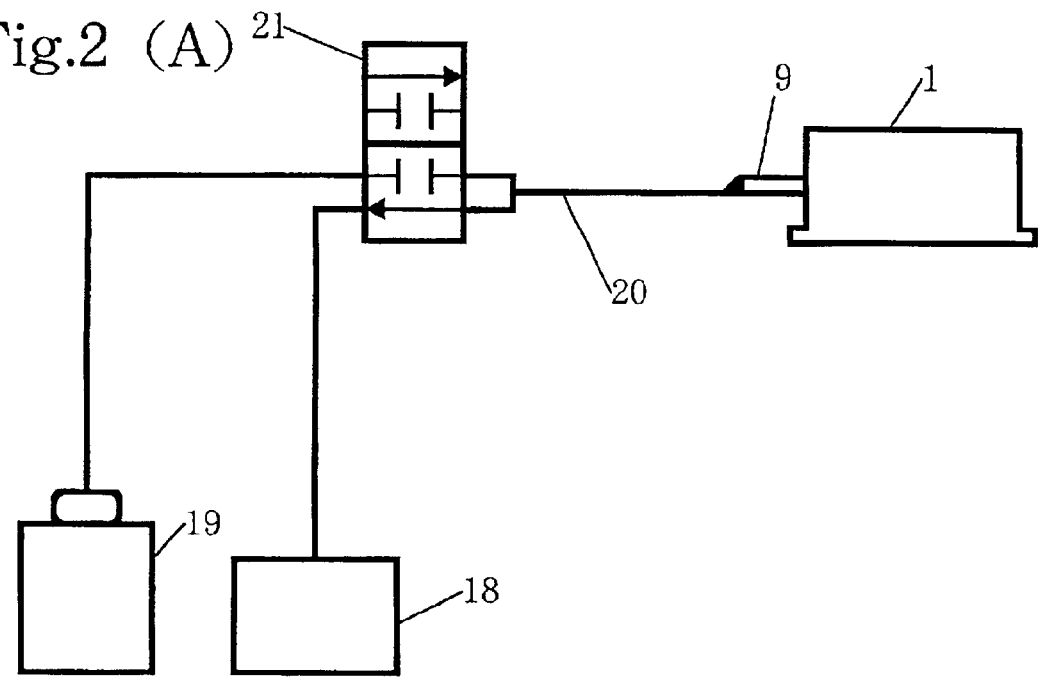
Figure 2:
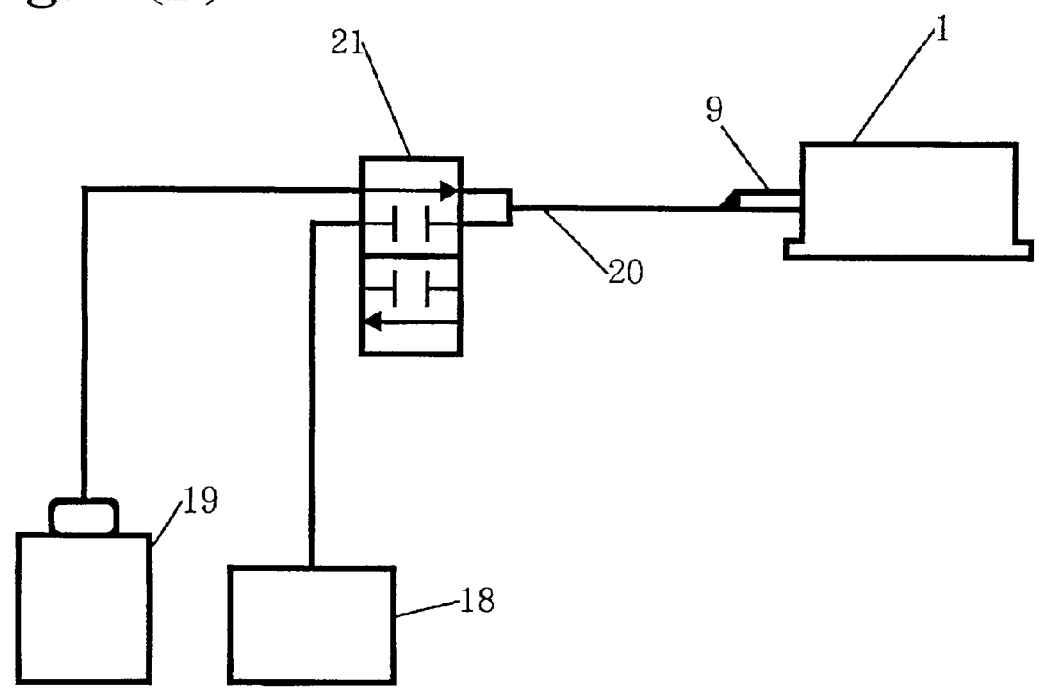

Referring to FIG. 2, in this system, the vent 9 is connected to an exhaust device 18 such as rotary pump or the like and a low heat conduction gas introducing device 19 through a piping 20 which includes a selector valve 21.

The tip end of the piping 20 connected to the exhaust device 18 and low heat conduction gas introducing device 19 will be mounted on the vent 9 after the lid portion 1b has been seam welded to the main body 1a of the package 1.

Next, the selector valve 21 is switched to connect with the exhaust device 18 which is in turn actuated to evacuate the interior of the package 1 through the vent 9 (see FIG. 2A).

Next, the selector valve 21 is switched to connect with the low heat conduction gas introducing device 19 which is in turn actuated to introduce the low heat conduction type gas such as xenon into the interior of the package 1 through the vent 9 (see FIG. 2B).

When the package 1 is fully filled with the low heat conduction type gas, the external end of the vent 9 is swaged to provide a temporary seal and cut before the swaged end portion or adjacent portion of the vent 9 is welded to seal the vent 9.

Figure 3:
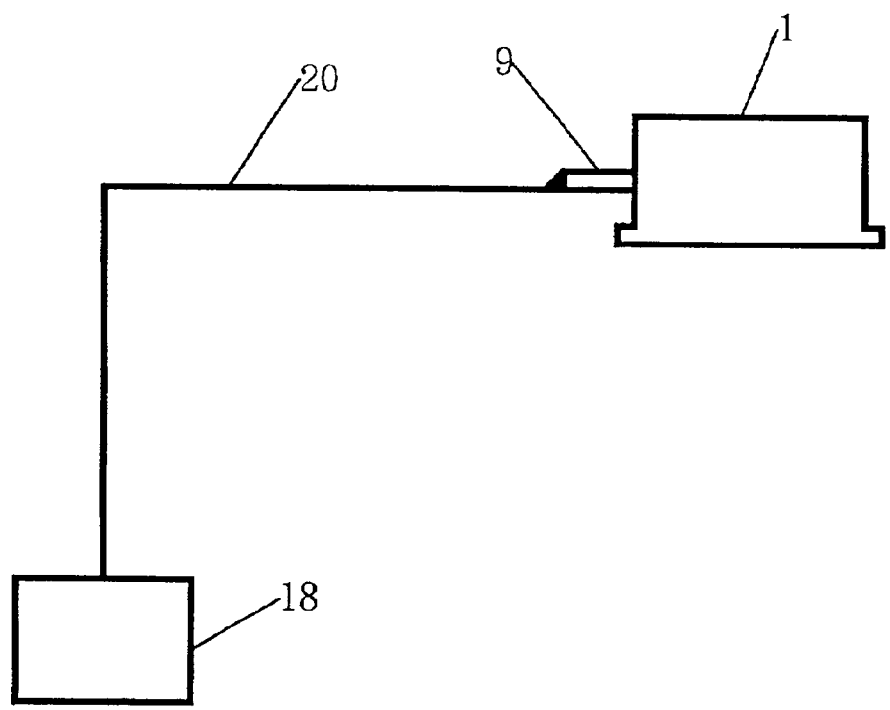
FIG. 3 is a block diagram of a system for depressurizing the semiconductor laser module according to the first embodiment of the present invention.

FIG. 3 is a block diagram of a system for depressurizing the semiconductor laser module according to the first embodiment of the present invention.

In this system, the exhaust device 18 is connected directly to the vent 9 through the piping 20.

The tip end of the piping 20 connected to the exhaust device 18 will be mounted on the vent 9 after the lid portion 1b has been seam welded to the main body 1a of the package 1.

Next, the package 1 is evacuated, for example, up to about $10^3$ Torr., by the exhaust device 18 through the vent 9.

When the pressure within the package 1 has been reduced to the desired level, the outer tip end of the vent 9 is swaged to provide a temporary seal. The swaged or adjacent portion of the vent 9 is then welded to be sealed.

According to the first embodiment of the present invention, the amount of low heat conduction type gas used can be suppressed to 2–5 ml substantially equal to the internal volume of the package 1, in comparison with the prior art which required the amount of gas between 20 and 25 liters per minute.

The first embodiment does not use any expensive noble gas in an increased amount and require any vacuum chamber or automated seam welder to be used in the vacuum chamber. Thus, the semiconductor laser module can inexpensively be produced through a simplified system.

FIGS. 4A and B are block diagrams of a system for introducing a low heat conduction type gas into a semiconductor laser module constructed according to a second embodiment of the present invention: FIG. 1A shows the module being evacuated and FIG. 1B shows the module into which the low heat conduction type gas is introduced.

Figure 4:
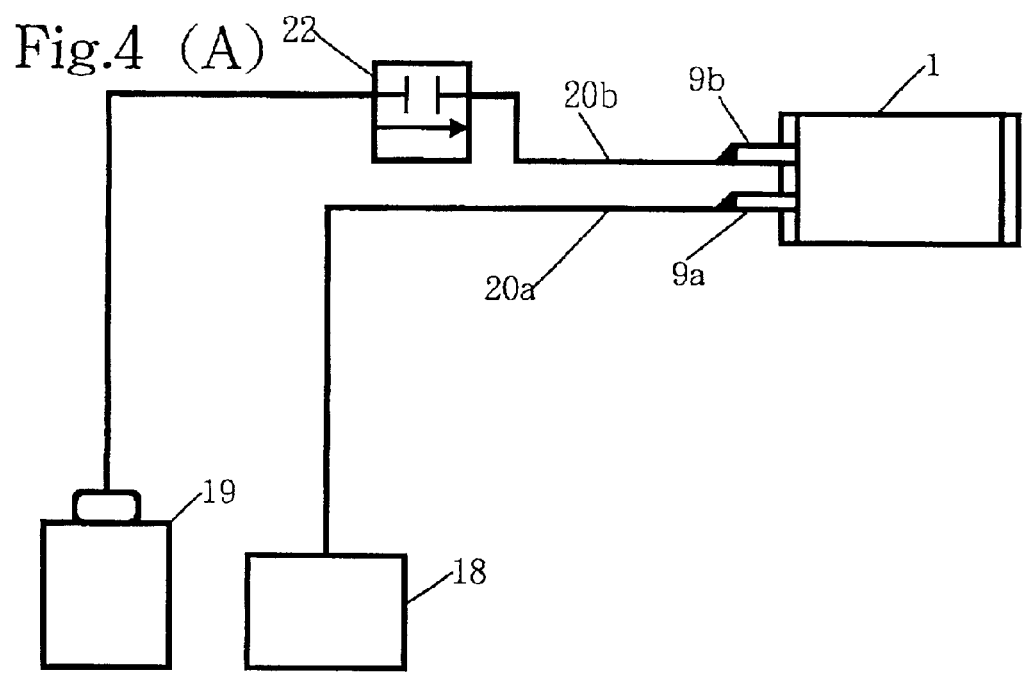
FIGS. 4A and B are block diagrams of a system for introducing a low heat conduction type gas into a semiconductor laser module constructed according to a second embodiment of the present invention.
Figure 4:
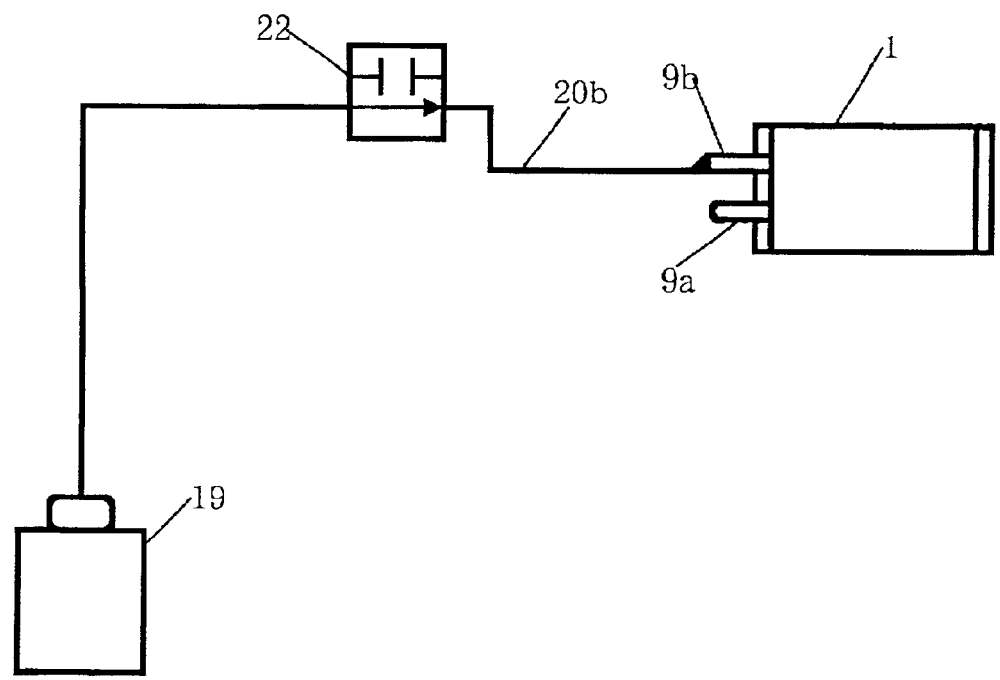

Referring to FIG. 4, the second embodiment comprises first and second vents 9a, 9b mounted on the package 1 and spaced parallel apart from each other. The first vent 9a is used for gas exhaust while the second vent 9b is used for gas introduction.

The exhaust device 18 is connected with the first vent 9a through a first piping 20a. The low heat conduction gas introducing device 19 is connected with the second vent 9b through a second piping 20b which includes an open/close valve 22.

After the lid portion 1b has been seam welded to the main body 1a of the package 1, the tip end of the first piping 20a connected with the exhaust device 18 will be attached to the first vent 9a and the tip end of the second piping 20b connected with the low heat conduction gas introducing device 19 will be attached to the second vent 9b. At this time, the open/close valve 22 is in its closed position (see FIG. 4A).

Next, the package 1 is evacuated by the exhaust device 18 through the first vent 9a.

The outer end of the first vent 9a is cut after it has been swaged to provide a temporary seal. The swaged or adjacent portion of the first vent 9a is then welded to seal it.

Next, the open/close valve 22 is opened to introduce the low heat conduction type gas such as xenon from the low heat conduction gas introducing device 19 into the package 1 through the second vent 9b (see FIG. 4B).

When the interior of the package 1 is fully filled with the low heat conduction type gas, the outer end of the second vent 9b is swaged to provide a temporary seal and cut. The swaged or adjacent portion of the second vent 9b is then welded to seal it.

According to the second embodiment, two branched vents, that is, the first exhaust vent 9a and the second gas-introduction vent 9b, are used. Thus, any selector valve is not required. Moreover, the gas exhaust and introduction can be improved in reliability.

The present invention is not limited to the above embodiments, but may be carried out in any of various other forms without departing from the spirit and scope of the invention which will be defined in the appending claims.

What is claimed is:

1. A semiconductor laser module comprising:

a semiconductor laser element configured to produce laser light;

a package being hermetically sealed and having an interior space that contains the semiconductor laser element, a first side allowing said laser light to pass therethrough, and a second side positioned across said interior space from said first side;

a vent member disposed in said second side and extending from said interior space to a space that is exterior to said package, said vent member configured to transport the low heat conduction gas from a gas source to the interior space when unsealed, and said vent member configured to prevent a flow of gas between the interior space and the exterior when sealed.

2. The semiconductor laser module according to claim 1, wherein:

said vent member is shaped as a pipe.

3. The semiconductor laser module according to claim 1, wherein:

said vent member is hermetically sealed after an occurrence of at least one of a first condition and a second condition, said first condition being that the low heat conductor gas has been introduced into the package via the vent member, and said second condition being that the low heat conduction gas has been exhausted from the package via the vent member.

4. The semiconductor laser module of claim 3, wherein:

the vent member contains a portion that extends beyond the second side of said package, and the portion of said vent member is sealed first by being swaged and subsequently by being welded.

5. The semiconductor laser module of claim 3, wherein:

said vent member is configured to receive the low heat conduction gas from a gas introducing device when said vent member is not sealed.

6. The semiconductor laser module of claim 5, wherein:

said vent member is configured to receive the low heat conduction gas from the gas introducing device via a controllable valve.

7. The semiconductor laser module of claim 5, wherein:

said selector device is configured to select one of
the low heat conduction gas from the gas introducing device to be provided to the package, and
gas contained in the interior space of the package to be exhausted from the interior space.

8. The semiconductor laser module of claim 1, further comprising:

another vent member that extends from said interior space to outside of said package, said another vent member configured to exhaust gas from said interior space when unsealed.

9. The semiconductor laser module of claim 1, wherein:

said vent member is configured to be sealed by being swaged closed.

10. The semiconductor laser module of claim 9, wherein:

said vent member is configured to be permanently sealed by being welded shut after being swaged.

11. A semiconductor laser module comprising:

a semiconductor laser element configured to produce laser light;

a package hermetically sealed and having an interior space that contains the semiconductor laser element, a first side allowing said laser light to pass therethrough, and a second side positioned across said interior space from said first side;

means for providing a low heat conduction gas to the interior space, said means for providing a low heat conduction gas being disposed in said second side; and means for exhausting gas from the interior space, said means for exhausting gas being disposed in said second side.

* * * * *